United States Patent
Schroth et al.

(10) Patent No.: US 8,149,059 B2
(45) Date of Patent: Apr. 3, 2012

(54) METHOD AND APPARATUS FOR COMPENSATING FOR GAIN CHANGES IN AN AMPLIFIER CIRCUIT

(75) Inventors: Joerg Schroth, Ulm (DE); Rolf Reber, Ulm (DE); Rainer Rittmeyer, Ulm (DE); Hardy Sledzik, Blaustein (DE)

(73) Assignee: EADS Deutschland GmbH, Ottobrunn (DE)

( * ) Notice: Subject to any disclaimer, the term of this patent is extended or adjusted under 35 U.S.C. 154(b) by 0 days.

(21) Appl. No.: 12/934,954

(22) PCT Filed: Mar. 14, 2009

(86) PCT No.: PCT/DE2009/000355
§ 371 (c)(1),
(2), (4) Date: Nov. 15, 2010

(87) PCT Pub. No.: WO2009/117982
PCT Pub. Date: Oct. 1, 2009

(65) Prior Publication Data
US 2011/0050346 A1    Mar. 3, 2011

(30) Foreign Application Priority Data
Mar. 28, 2008   (DE) .................. 10 2008 016 154

(51) Int. Cl.
*H03F 3/04*   (2006.01)
(52) U.S. Cl. .................. 330/289; 330/144; 330/284
(58) Field of Classification Search .............. 330/289, 330/144, 284
See application file for complete search history.

(56) References Cited

U.S. PATENT DOCUMENTS

| | | | | |
|---|---|---|---|---|
| 5,101,173 A | * | 3/1992 | DiPiazza et al. | 330/136 |
| 5,867,060 A | * | 2/1999 | Burkett et al. | 330/2 |
| 6,677,823 B2 | * | 1/2004 | Terosky et al. | 330/289 |
| 6,759,902 B2 | * | 7/2004 | Kossor | 330/136 |
| 6,836,184 B1 | | 12/2004 | Daughtry et al. | |
| 7,103,029 B1 | | 9/2006 | Minowa | |

(Continued)

FOREIGN PATENT DOCUMENTS

EP   1 293 798 A2   3/2003

(Continued)

OTHER PUBLICATIONS

International Search Report dated Oct. 2, 2009 (three (3) pages).

*Primary Examiner* — Patricia Nguyen
(74) *Attorney, Agent, or Firm* — Crowell & Moring LLP

(57) ABSTRACT

In a method and apparatus for compensating for gain changes in an amplifier circuit comprising radio-frequency modules and attenuation elements, a radio-frequency module is driven with a first temperature-dependent monitoring voltage $U_{HF}(T)$, and an attenuation element with a second temperature-dependent monitoring voltage $U_{VG}(T)$. The first temperature-dependent monitoring voltage $U_{HF}(T)$ is produced by applying a temperature dependency to an individual monitoring voltage $U_{opt}$, which is predetermined for a predetermined temperature for a radio-frequency module, in order to set the optimum operating point of the radio-frequency module. The second temperature-dependent monitoring voltage $U_{VG}(T)$ is produced by applying a temperature dependency to a predetermined monitoring voltage $U_{VG\_T}$ for the attenuation element. The monitoring voltage $U_{VG\_T}$ is determined in an iteration method, such that the output power of the amplifier circuit reaches a predeterminable level at a constant input power. Memory devices are provided for storing values for producing monitoring voltages for the radio-frequency modules and attenuation elements.

13 Claims, 2 Drawing Sheets

U.S. PATENT DOCUMENTS

| | | | |
|---|---|---|---|
| 7,161,426 B2 * | 1/2007 | Hu et al. | 330/129 |
| 2002/0158688 A1 | 10/2002 | Terosky et al. | |
| 2004/0232991 A1 | 11/2004 | Zhou et al. | |
| 2007/0243846 A1 | 10/2007 | Kirisawa | |
| 2008/0278236 A1 * | 11/2008 | Seymour | 330/279 |

FOREIGN PATENT DOCUMENTS

| | | |
|---|---|---|
| EP | 1 686 687 A1 | 8/2006 |
| JP | 2000-82928 A | 3/2000 |

* cited by examiner

METHOD AND APPARATUS FOR COMPENSATING FOR GAIN CHANGES IN AN AMPLIFIER CIRCUIT

This application is a national stage of PCT International Application No. PCT/DE2009/000355, filed Mar. 14, 2009, which claims priority under 35 U.S.C. §119 to German Patent Application No. 10 2008 016 154.3, filed Mar. 28, 2008, the entire disclosure of which is herein expressly incorporated by reference.

BACKGROUND AND SUMMARY OF THE INVENTION

The invention relates to a method and an apparatus for compensating for gain changes in an amplifier circuit.

Circuits for processing RF signals, for example in transmission/receiving modules for phase-controlled antennas, normally comprise GaAs radio-frequency modules in the form of monolithically integrated microwave circuits (MMIC). The component characteristics of such RF components are generally temperature-dependent; that is, the electrical characteristics of the RF components vary as a function of the temperature. This temperature dependency of the RF components disadvantageously influences the electrical characteristics of the modules and circuits in which the RF components are installed.

GaAs radio-frequency modules furthermore have a scatter of their optimum monitoring voltage (for example gate voltage), in particular from one wafer to another and from one batch to another. The requirements may vary from about −1.0 volt to 0 volts. The components of a wafer can be operated with an identical gate voltage, although a scatter remains in the RF characteristics from one component to another.

Manual individual adjustment of the circuits or modules is time-consuming and costly, and is unreasonable at a high production rate. It is therefore desirable to design the module or the circuit such that component scatters are automatically corrected (spread compensation), and temperature effects are largely compensated for by simple, temperature-dependent control (temperature compensation).

European patent document EP 1 293 798 B1 discloses a circuit for a transmitting/receiving module which allows the output power to be regulated in a stable form and largely independently of external influences. In this case, the output power of the transmitting/receiving module is controlled by deliberately adjusting the input power of the transmission chain, with a closed-loop control system always keeping the gain of the amplifiers in the transmission chain constant with respect to the gain of the RF transmission signal. If the amplifier gain is constant, the output power is known when the input power is set with an amplifier with variable gain in the transmitting/receiving module.

One object of the present invention is to provide a method which makes it possible to compensate for component scatters and temperature effects in RF components.

A further object is to provide an apparatus for compensating for gain changes in amplifier circuits.

These and other objects and advantages are achieved by the compensation apparatus according to the invention, which comprises memory devices for permanent storage of values for producing monitoring voltages for the radio-frequency modules and attenuation elements, and electrical circuits having an input and an output for producing a temperature-dependent output voltage taking account of a temperature-dependent input voltage $U_{ACT}(T)$, which is applied to the electrical circuits, and a value which is stored in the memory devices, wherein the stored value corresponds to an individual monitoring voltage $U_{opt}$ for setting the optimum operating point of the radio-frequency modules.

Fundamentally, the expression "attenuation element" in the following text means an amplifier with variable gain, and a "radio-frequency module" means a monolithically integrated microwave circuit (MMIC).

In the method according to the invention, a radio-frequency module is driven with a first temperature-dependent monitoring voltage $U_{HF}(T)$, and an attenuation element with a second temperature-dependent monitoring voltage $U_{VG}(T)$. The first temperature-dependent monitoring voltage $U_{HF}(T)$ is in this case produced by applying a temperature dependency to an individual monitoring voltage $U_{opt}$, which is predetermined for a predetermined temperature for a radio-frequency module, in order to set the optimum operating point of the radio-frequency module. Correspondingly, the second temperature-dependent monitoring voltage $U_{VG}(T)$ is produced by applying a temperature dependency to a predetermined monitoring voltage $U_{VG\_T}$ for the attenuation element. The monitoring voltage $U_{VG\_T}$ is determined by setting the monitoring voltage $U_{VG\_T}$ in an iteration method such that the output power of the amplifier circuit reaches a predeterminable level at a constant input power.

The first temperature-dependent monitoring voltage $U_{HF}(T)$ is based on a voltage stated by the manufacturer of the radio-frequency component. This voltage is individual for the respectively produced wafer and indicates the individual monitoring voltage $U_{opt}$ for setting the optimum operating point for a radio-frequency module in this wafer.

A data word which corresponds to this voltage (referred to as an individual monitoring voltage $U_{opt}$) is expediently read to a first memory device associated with the radio-frequency module. This data word is expediently read and stored once, and permanently, when the method is first carried out.

The scatter of the characteristics of the radio-frequency components is determined by RF measurement and is compensated for by means of a voltage-controlled attenuation element, by varying the voltage $U_{VG\_T}$ on the attenuation element in an iteration method, and thus setting the gain such that the desired gain is achieved between the input and the output of the amplifier circuit. This measurement is expediently carried out at a fixed temperature of, for example, 25° C. The data word which corresponds to this determined monitoring voltage $U_{VG\_T}$ is expediently read to a second memory device, which is associated with the attenuation element. The reading and storage of the value in the second memory device are carried out once and permanently when the method is first carried out.

The amplifier circuit may contain a chain of radio-frequency modules and/or attenuation elements. In this case, the data word for the individual monitoring voltage $U_{opt}$ is stored for each radio-frequency module, and the data work for the determined monitoring voltage $U_{VG\_T}$ is stored for each attenuation element. The storage process is in this case carried out in memory devices, wherein each radio-frequency module and each attenuation element in each case has a respectively associated memory device.

According to the invention, a radio-frequency module is driven with a temperature-dependent monitoring voltage $U_{HF}(T)$, with a temperature-dependent voltage being produced taking account of the stored data work for the monitoring voltage $U_{opt}$. Like the radio-frequency module, the attenuation element, which may expediently also be a variable-gain amplifier, is also driven with a temperature-dependent monitoring voltage $U_{VG\_T}$. In this case, a temperature-dependent voltage is produced taking account of the stored data word for the monitoring voltage $U_{VG\_T}$ determined by the iteration method.

An electrical circuit with one input and one output is provided for each RF module and each attenuation element, and a temperature-dependent input signal $U_{ACT}(T)$ is applied to the input of this electrical circuit. The input signal $U_{ACT}(T)$ is expediently produced by means of a diode as a temperature sensor, and an operational amplifier connected downstream from the diode. At the output, the electrical circuit produces a temperature-dependent monitoring voltage, wherein a temperature-dependency is applied to a voltage as a function of the input signal $U_{ACT}(T)$. This voltage in this case corresponds in each case to the value stored for one RF component or attenuation element. This temperature dependency may, for example, have a linear, square, exponential or polynomial profile.

Temperature-dependent changes in the characteristics of the radio-frequency modules are compensated for by the temperature dependency of the monitoring voltage $U_{HF}(T)$.

By way of example, radio-frequency components may be RF amplifier stages which are driven with a gate voltage or base voltage. For physical reasons, the gain of an amplifier stage changes by about 0.01 dB/K. By way of example, for 5 stages and a temperature change of 100 K would cause a gain change of about 5 dB (linear: factor 3). About 1/10 of this value or less is desirable. This problem is solved by temperature-dependent attenuation of the voltage-controlled attenuation element, particularly so as to compensate for the temperature-dependent gain change of the radio-frequency components.

In one advantageous refinement of the invention, the memory devices and electrical circuits are integrated in a digital potentiometer, which has one input, and one output for each radio-frequency module and each attenuation element. The temperature-dependent input voltage $U_{ACT}(T)$ is applied to the input, and the appropriate monitoring voltage for the radio-frequency component or attenuation element which is connected to the respective output is produced at the output. The values of the voltage dividers (division ratio) which lead to the monitoring voltages $U_{opt}$ for the radio-frequency components and to the monitoring voltages $U_{VG\_T}$ for the attenuation elements are expediently digitally stored in the memory device of the digital potentiometer.

Other objects, advantages and novel features of the present invention will become apparent from the following detailed description of the invention when considered in conjunction with the accompanying drawings.

DETAILED DESCRIPTION OF THE DRAWINGS

Figure 1:
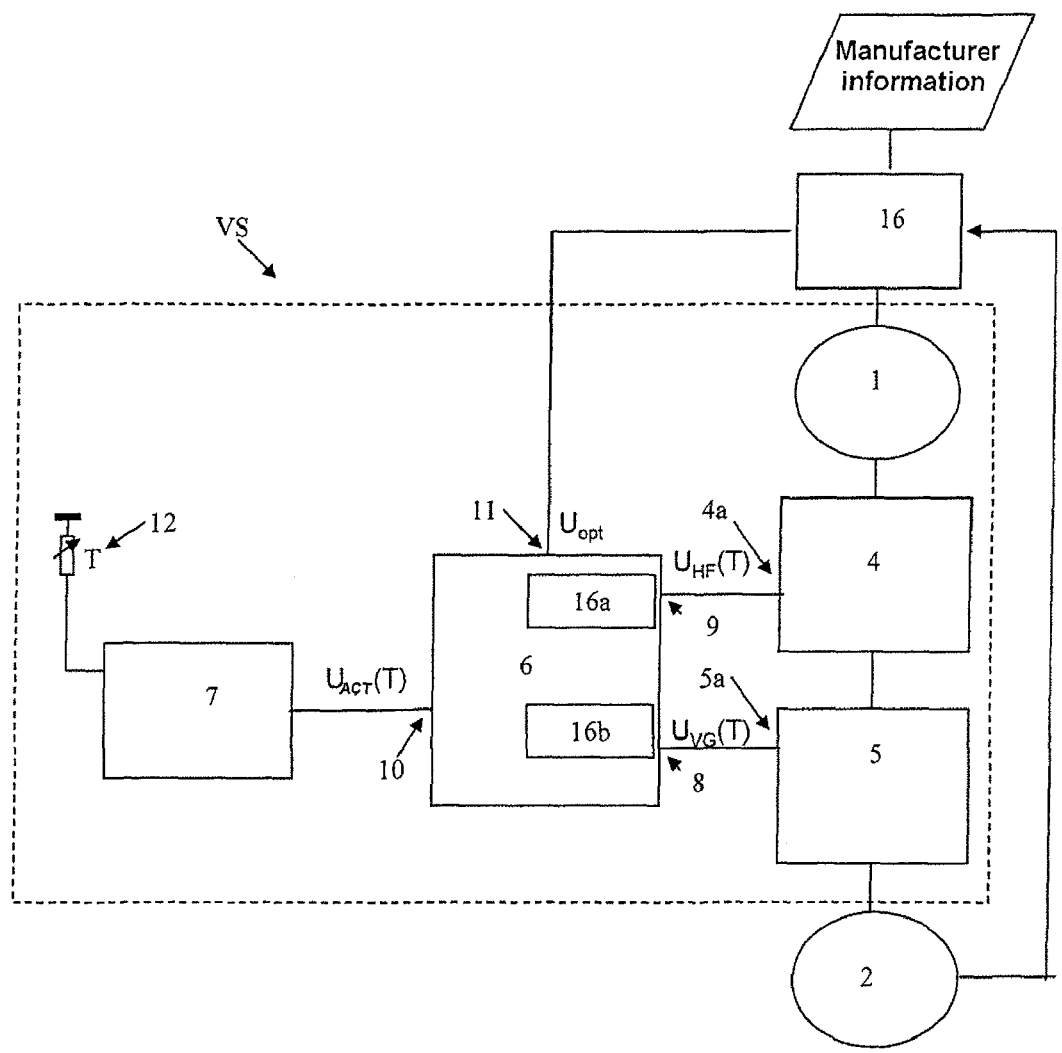
FIG. 1 shows an apparatus according to the invention for a receiving path of a transmitting/receiving module.
Figure 2:
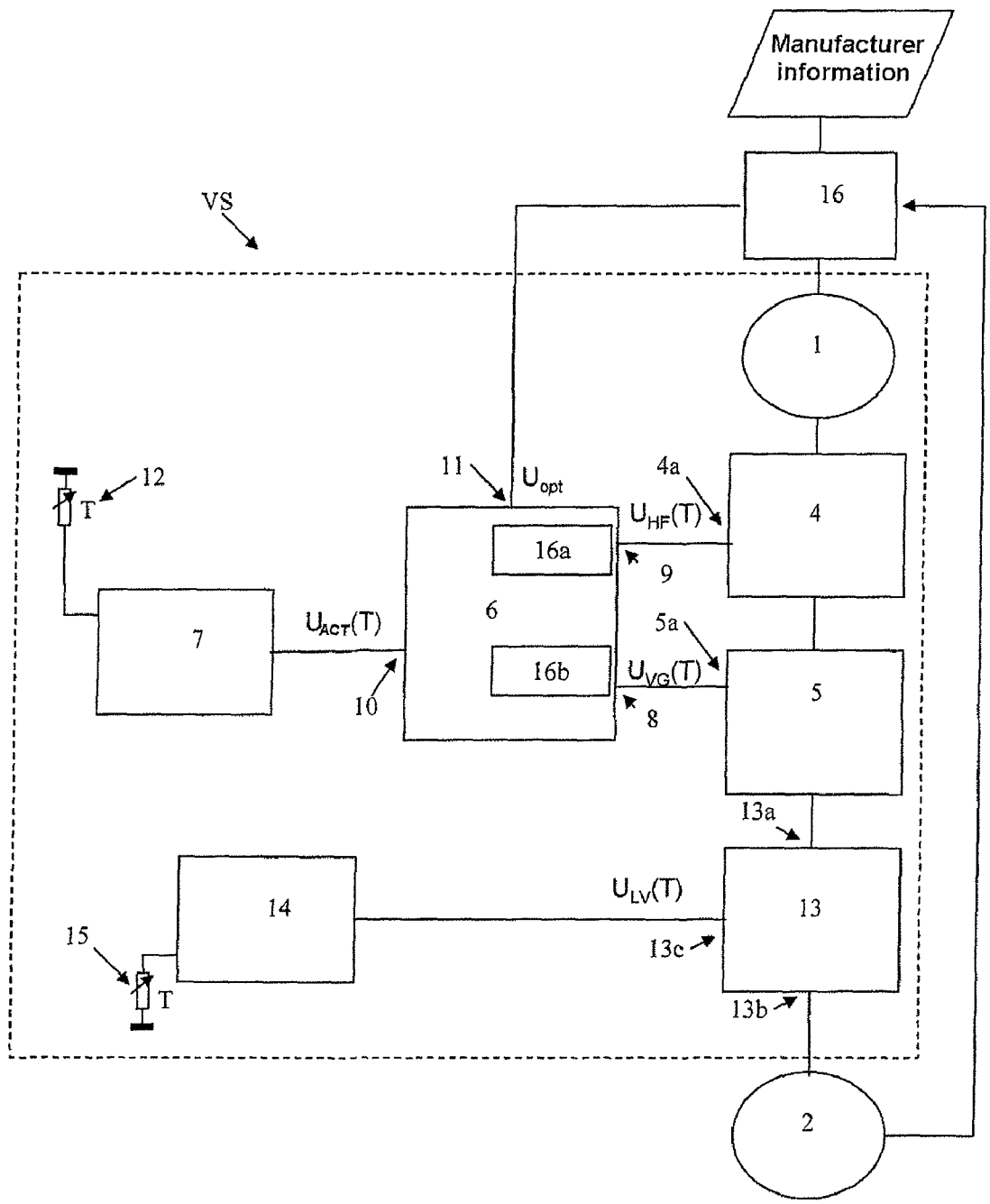
FIG. 2 shows an apparatus according to the invention for a transmitting path of a transmitting/receiving module.

The invention is explained in more detail in FIGS. 1 and 2, with reference to the transmitting and receiving paths of a transmitting/receiving module.

FIGS. 1 and 2 each show an amplifier circuit VS with an input 1 and an output 2. The input 1 is connected to a radio-frequency component 4. This radio-frequency component 4 is normally an amplifier stage. The radio-frequency component 4 is connected via an attenuation element 5 to the output 2. The RF component 4 has an input 4a, to which a temperature-dependent monitoring voltage $U_{HF}(T)$ is supplied. The variable attenuation element 5 has an input 5a, to which a temperature-dependent monitoring voltage $U_{VG}(T)$ is supplied.

The amplifier circuit VS has a digital potentiometer 6 with expediently integrated data memories 16a, 16b. The digital potentiometer 6 has an input 10 to which a temperature-dependent input voltage $U_{ACT}(T)$ is applied. Values can be read to the digital potentiometer 6, and stored in the data memories 16a, 16b, via a further input 11.

The amplifier circuit VS expediently has a diode 12 as a temperature sensor and a control amplifier 7, for example an operational amplifier, for amplification of the diode voltage. This arrangement results in the temperature-dependent voltage $U_{ACT}(T)$, which is supplied to the input 10 of the digital potentiometer 6, being produced at the output of the control amplifier 7.

The digital potentiometer 6 has a number of outputs 8, 9, with each RF component 4 and each attenuation element 5 being connected to one, and only one, output 8, 9. The output 8 of the potentiometer 6 is connected to the input 5a of the attenuation element, and the output 9 of the potentiometer 6 is connected to the input 4a of the RF component 4.

In one particular embodiment of the invention, FIG. 2 shows a transmitting path of a transmitting/receiving module. The amplifier circuit VS illustrated in FIG. 1 has in this case had a power amplifier 13 added to it, which is connected to the output 2 (FIG. 1). The output 2 of the amplifier circuit VS is therefore connected to the output 13b of the power amplifier 13. At the output 13b, this power amplifier 13 amplifies a transmission signal which is applied to the input 13a. The power amplifier 13 is supplied via a further input 13c with a pulsed temperature-dependent control voltage $U_{LV}(T)$.

The amplifier circuit VS furthermore has a resistance network 14 for producing a temperature-dependent control voltage $U_{LV}(T)$ for the output power amplifier 13. The resistance network 14 expediently comprises negative temperature-coefficient resistors 15 and a zener diode.

The output power amplifier 13 expediently comprises a power amplifier with an upstream driver amplifier (not illustrated). The temperature-dependent voltage $U_{LV}(T)$ of the resistance network influences on the one hand the gain of the driver amplifier (not illustrated) connected upstream of the power amplifier 13, and on the other hand the gain of the power amplifier 13 itself. For this purpose, the monitoring voltage of the driver amplifier and of the power amplifier 13 is varied with the temperature such that the maximum monitoring voltage is produced at the maximum operating temperature, and likewise decreases as the temperature decreases. The temperature dependency is controlled in the resistance network 14 via NTCs (negative temperature-coefficient resistors) and resistors. This counteracts the natural increase in the gain as the temperatures decrease, thus allowing the output voltage at the output 2 to be kept constant over a wide temperature range.

The following text explains how the monitoring voltage $U_{VG\_T}$ for the attenuation element is determined.

The determined value of the monitoring voltage $U_{VG\_T}$ corresponds to a predeterminable ratio of the output power at the output of the attenuation element 5 to the input power at the input 1 of the amplifier circuit VS.

This value is determined by means of a tester arrangement 16 when the circuit is set up. The circuit is expediently set up at a constant temperature of, for example, 25° C.

In this case, in a first step, a digital word (division ratio) is supplied to the input 11 of the digital potentiometer 6, corresponding to a voltage $U_{opt}$ which is individual for the respectively used RF component 4 that is driven by the potentiometer 6. This individual voltage $U_{opt}$, which is between about −1.0 and 0 volts, is governed by the production process for the RF component, and is known to a person skilled in the art. The division ratio for the voltage $U_{opt}$ is stored in a memory module 16a that is integrated in the potentiometer 6. The memory module 16a may, of course, also be arranged separately from the potentiometer 6, with an electrical connection to the potentiometer 6.

On the basis of the stored division ratio and the temperature-dependent voltage $U_{ACT}(T)$ at the input 10, the digital potentiometer 6 produces an analog temperature-dependent voltage $U_{HF}(T)$ at the output 9, and this is supplied as a monitoring voltage to the RF component.

Test signals are then supplied by means of the tester arrangement 16 to the input 1 of the amplifier circuit VS, and the monitoring voltage $U_{VG\_T}$ at the attenuation element 5, and hence its attenuation, are varied by varying the division ratio associated with the output 8, until the desired gain of the amplifier circuit is achieved at the output of the attenuation element 5. The resultant division ratio is stored in the expediently non-volatile memory 16b in the digital potentiometer 6. The memory module 16b may, of course, also be arranged separately from the potentiometer 6, with an electrical connection to the potentiometer 6.

The invention replaces the previous method, in which the optimum voltage $U_{opt}$ in each amplifier circuit is achieved by soldering or bonding a defined setting of a resistance network, by an electronic method. This is an automated step in automated manufacture. Previously, this was a manual activity.

The compensation for the unavoidable parameter scatter and the temperature dependency of the RF components can be achieved either by manual adjustment or complex closed-loop control. The invention means that a voltage $U_{opt}$ for the RF component and a voltage $U_{VG\_T}$ for the attenuation element are defined in a single step, and can then be varied automatically corresponding to the temperature. This results in the advantages that the RF components need not be specified with very tight tolerances, thus increasing the yield for the manufacturer (GaAs foundry). At the same time, the prices of the RF components can thus be reduced. Furthermore, the scatter in the amplifier circuit VS can be reduced by a factor of about 10. This increases the manufacturing yield of the amplifier circuit VS.

The memory device, the electrical control circuit and the digital potentiometer are expediently integrated in an application-specific integrated circuit, that is to say a so-called ASIC.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method of compensating for gain changes in an amplifier circuit, comprising radio-frequency modules and attenuation elements, said method comprising:

driving a radio-frequency module with a first temperature-dependent monitoring voltage $U_{HF}(T)$, and an attenuation element with a second temperature-dependent monitoring voltage $U_{VG}(T)$; wherein, the first temperature-dependent monitoring voltage $U_{HF}(T)$ is produced by applying a temperature dependency to an individual monitoring voltage $U_{opt}$, which is predetermined for a predetermined temperature for a radio-frequency module, to set the optimum operating point of the radio-frequency module;

the second temperature-dependent monitoring voltage $U_{VG}(T)$ is produced by applying a temperature dependency to a predetermined monitoring voltage $U_{VG\_T}$ for the attenuation element; and the monitoring voltage $U_{VG\_T}$ is determined by an iteration method such that the output power of the amplifier circuit reaches a predeterminable level at a constant input power.

2. The method as claimed in claim 1, wherein the value of the monitoring voltage $U_{opt}$ is converted to a division ratio, and is read to a first memory device.

3. The method as claimed in claim 1, wherein a value of the determined monitoring voltage $U_{VG\_T}$ which corresponds to the ratio of the output power to the input power of the amplifier circuit is converted to a division ratio, and is read to a second memory device.

4. The method as claimed in claim 1, wherein a power amplifier is driven with a temperature-dependent monitoring voltage $U_{LV}(T)$.

5. The method as claimed in claim 4, wherein the power amplifier is driven with a pulsed monitoring voltage $U_{LV}(T)$.

6. An apparatus for compensating for gain changes in an amplifier circuit comprising radio-frequency modules and attenuation elements, said apparatus comprising:

memory devices for permanent storage of values for producing monitoring voltages for the radio-frequency modules and attenuation elements; and electrical circuits having an input and an output for producing a temperature-dependent output voltage taking account of a temperature-dependent input voltage $U_{AcT}(T)$, which is applied to the electrical circuits, and a value which is stored in the memory devices, wherein, the stored value corresponds to an individual monitoring voltage $U_{opt}$ for setting the optimum operating point of the radio-frequency modules;

each radio-frequency module and each attenuation element has an associated memory device; and the apparatus further comprises an output power amplifier and a resistance network for producing a monitoring voltage for the output power amplifier.

7. The apparatus as claimed in claim 6, having an electrical control circuit comprising:

a temperature sensor; and an operational amplifier connected downstream from the temperature sensor, for producing the temperature-dependent voltage $U_{ACT}(T)$.

8. The apparatus as claimed in claim 7, wherein said temperature sensor comprises one of a diode, a transistor and an integrated circuit.

9. The apparatus as claimed in claim 7, wherein the resistance network comprises negative temperature-coefficient resistors.

10. The apparatus as claimed in claim 6, wherein the memory devices and electrical circuits are integrated in a digital potentiometer, with an input for supplying a temperature-dependent input signal $U_{ACT}(T)$ as well as outputs which are respectively associated with a radio-frequency module and an attenuation element.

11. The apparatus as claimed in claim 10, wherein the memory device, the electrical control circuit and the digital potentiometer are integrated in an application-specific integrated circuit.

12. The apparatus as claimed in claim 11, wherein the memory devices and electrical circuits are integrated in a digital potentiometer, with an input for supplying a temperature-dependent input signal $U_{AcT}(T)$ as well as outputs which are respectively associated with a radio-frequency module and an attenuation element.

13. The apparatus as claimed in claim 12, the memory device, the electrical control circuit and the digital potentiometer are integrated in an application-specific integrated circuit.

* * * * *